US008566768B1

(12) United States Patent
Shukla et al.

(10) Patent No.: US 8,566,768 B1
(45) Date of Patent: Oct. 22, 2013

(54) BEST CLOCK FREQUENCY SEARCH FOR FPGA-BASED DESIGN

(75) Inventors: Sunil K. Shukla, TarryTown, NY (US); Perry S. Cheng, Cambridge, MA (US); Rodric Rabbah, Yonkers, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/441,053

(22) Filed: Apr. 6, 2012

(51) Int. Cl.
*G06F 17/50* (2006.01)

(52) U.S. Cl.
USPC .......................................... 716/108

(58) Field of Classification Search
USPC .......................................... 716/108
See application file for complete search history.

(56) References Cited

U.S. PATENT DOCUMENTS

| 2002/0073380 | A1* | 6/2002 | Cooke et al. ............. | 716/1 |
| 2004/0225970 | A1* | 11/2004 | Oktem ............. | 716/1 |
| 2010/0218146 | A1* | 8/2010 | Platzker et al. ............. | 716/4 |

OTHER PUBLICATIONS

Holzer, M. "Design Space Exploration with Evolutionary Multi-Objective Optimisation" Proc. Industrial Embedded System pp. 125-133, Lisbon, Portugal 2007.
Kaul, M. "Temporal Partitioning Combined with Design Space Exploration for Latency Minimization of Run-Time Reconfigured Designs" Laboratory for Digital Design Environments, Depart of ECECS 1999.
Gries, M. "Methods for Evaluating and Covering the Design Space during Early Design Development" Technical Memorandum UCB/ERL M003/32 Aug. 12, 2003.
Palesi, M. "Multi-Objective Design Space Exploration using Genetic Algorithms" International Workshop on Hardware/Software Codesign 2002.
Keinert, J. "SystemCoDesigner—An Automatic ESL Synthesis Approach by Design Space Exploration adn Behavioral Synthesis for Streamling Applications" ACM Transactions on Design Automation of Electronic Systems (TODAES) TODAES Homepage archive vol. 14 Issue 1, Jan. 2009.
J. M. Rabaey, C. Chu, P. Hoang, M. Potkonjak "Fast Prototyping of Datapath-Intensive Architectures" IEEE Computer Society Press IEEE Design & Test , vol. 8 Issue 2 Apr. 1991.
W.-L. Hung, Xiaoxia Wu, Yuan Xie "Guaranteeing performance yield in high-level synthesis" ICCAD '06: Proceedings of the 2006 IEEE/ACM international conference on Computer-aided design Nov. 5-9, 2006 San Jose, CA.
Shrott, R.et al. "ExploreAhead: A Methodical Approach to Improved QOR through Implementation Tools", White Paper 268, www.xilinx.com, May 11, 2007.

(Continued)

*Primary Examiner* — Jack Chiang
*Assistant Examiner* — Mohammed Alam
(74) *Attorney, Agent, or Firm* — Scully, Scott, Murphy & Presser, P.C.; Louis J. Percello, Esq.

(57) ABSTRACT

Searching for desired clock frequency for integrated circuit-based design may receive timing result of a hardware synthesis job executed based on a code specifying hardware design. One or more different timing constraints specifying respective one or more different clock frequencies than used in the hardware synthesis job may be automatically generated without modifying the code. One or more instances of the hardware synthesis job to run with the respective one or more different timing constraints may be automatically spawned. The automatic generation and spawning may repeat until a termination criterion is met, and/or a desired successful timing constraint is identified for the hardware design from the different timing constraints based on whether the one or more instances of the hardware synthesis job met their respective timing constraints.

22 Claims, 3 Drawing Sheets

(56) References Cited

OTHER PUBLICATIONS

So, B. et al. "A Compiler Approach to Fast Hardware Design Space Exploration in FPGA-based Systems" In Proceedings of ACM SIGPLAN Conference on Programming Language Design and Implementation, pp. 165-176 Jun. 17-19, 2002.

Sun, W. et al., "FPGA Pipeline Synthesis Design Exploration Using Module Selection and Resource Sharing" Computer-Aided Design of Integrated Circuits and Systems, IEEE Transactions, vol. 26 Issue 2 Feb. 2007.

Dutta, R. "Distributed design-space exploration for high-level synthesis systems" Design Automation Conference, 1992. Proceedings., 29th ACM/IEEE pp. 644-650 , Publication Year: 1992.

* cited by examiner

BEST CLOCK FREQUENCY SEARCH FOR FPGA-BASED DESIGN

FIELD

The present application relates generally to computers and digital circuit design, and more particularly to searching for the best clock frequency for integrated circuit-based design such as FPGA-based or like hardware design.

BACKGROUND

A digital circuit design process involves design formulation and specification, register transfer level (RTL) coding, functional and timing verification and synthesis. The design specification among other things specifies the throughput, area and power requirements that the design is expected to meet. A description of a digital circuit, usually in very-high-speed integrated circuits (VHSIC) hardware description language (VHDL) or Verilog, undergoes synthesis using vendor specific synthesis tools. VHDL and Verilog are examples of hardware description languages used for programming a Field Programmable Gate Array (FPGA) or an Application Specific Integrated Circuit (ASIC). A common design synthesis tool flow involves a number of phases which vary depending on the toolchain vendor. For example, synthesis using the Xilinx® toolchain involves a number of steps including Synthesis, Translate, MAP, PAR, and Bitgen, ultimately producing a bitstream file to program the FPGA if the synthesis is successful. The synthesis toolchain also produces design statistics such as the area occupied by the design, the maximum clock frequency and the approximate power consumption.

As a part of the design specification, the designer either has a specific throughput requirement for the application or the designer may simply want to achieve the best possible throughput. The clock frequency at which a design operates at is usually directly proportional to throughput. When a design has throughput requirements, the design is subject to timing constraints during synthesis. The synthesis toolchain reports whether the timing constraints are satisfied—the design is said to have timing-closure. In case one or more timing constraints are not satisfied, the design undergoes manual iteration and resynthesis until all the constraints are met. This is time consuming and possibly intrusive because ultimately the actual description of the hardware at the source level must change.

When there are no specific throughput requirements (i.e., the best throughput is desired), the synthesis process is usually applied without any timing constraints, and the synthesis tool reports the operating frequency it achieved.

In either case described above, the existing methodology for synthesis and timing-closure either requires manual iteration and tuning of the design or absent a thorough iterative process, a design may not achieve the best possible clock frequency. Some of the challenges are attributed to the non-linear behavior of the synthesis tool. Non-linearity with respect to timing-closure means the synthesis tool may report failure at a clock frequency contrainted to 100 MHz but success at a clock frequency of 110 MHz. The non-linearity implies that one cannot stop exploring higher clock frequencies simply because a lower clock frequency fails in timing-closure.

BRIEF SUMMARY

A method of searching for desired clock frequency for integrated circuit-based design, in one aspect, may include receiving timing result of a hardware synthesis job executed based on a code specifying hardware design. The method may also include automatically generating without modifying the code, one or more different timing constraints specifying respective one or more different clock frequencies than used in the hardware synthesis job. The method may further include automatically spawning one or more instances of the hardware synthesis job to run with the respective one or more different timing constraints. The method may also include repeating the steps of automatically generating and automatically spawning until a termination criterion is met, or a desired successful timing constraint is identified for the hardware design from the different timing constraints based on whether said one or more instances of the hardware synthesis job met their respective timing constraints, or combination of both the termination criterion is met and the desired successful timing constraint is identified.

A system for searching for desired clock frequency for integrated circuit-based design, in one aspect, may include a hardware design synthesis module operable to receive timing result of a hardware synthesis job executed based on a code specifying hardware design. The hardware design synthesis module may be further operable to automatically generate without modifying the code, one or more different timing constraints specifying respective one or more different clock frequencies than used in the hardware synthesis job. The hardware design synthesis module may be further operable to automatically spawn one or more instances of the hardware synthesis job to run with the respective one or more different timing constraints. The hardware design synthesis module may be further operable to repeat the receiving, generating, and spawning until a termination criterion is met, or a desired successful timing constraint is identified for the hardware design from the different timing constraints based on whether said one or more instances of the hardware synthesis job met their respective timing constraints, or combination of both the termination criterion is met and the desired successful timing constraint is identified A computer readable storage medium storing a program of instructions executable by a machine to perform one or more methods described herein also may be provided.

Further features as well as the structure and operation of various embodiments are described in detail below with reference to the accompanying drawings. In the drawings, like reference numbers indicate identical or functionally similar elements.

DETAILED DESCRIPTION

The present disclosure describes several methods that improve the existing synthesis process, and how to explore the search space automatically to determine the highest clock-frequency achievable for a given design, for instance, without modifying the original design. This means that designs that have passed functional verification do not have to be reverified.

In one embodiment of the present disclosure, a method is provided to explore through synthesis the highest frequency that a circuit can be clocked. In another embodiment of the present disclosure, a method is provided to perform automatic area-speed trade-offs. In yet another embodiment of the present disclosure, synthesis-as-a-service is provided, for example, by enabling in a cloud environment or remote execution the above methods of exploring through synthesis the highest frequency that a circuit can be clocked and/or performing automatic area-speed trade-offs. The above methods may be achieved without making any modifications to the RTL source code or the netlists. Netlists refer to the connectivity of an electronic design, and descriptions of the parts or devices used. In one embodiment of the present disclosure, the process or method of the present disclosure may be carried out automatically and may be completely transparent to the user (hidden from the user). The end result in one embodiment is a bitstream which can be used to program a reconfigurable architecture such as a FPGA.

A user may provide a manifest of design files including RTL, netlists and design constraints to a design exploration tool (DET) of the present disclosure. A manifest, for example, includes a list of files needed for synthesis. Timing constraints may be expressed by setting multiple parameters that adjust one or more base clocks with a multiplicative or dividing factor. A fraction consisting of the multiplicative factor in the numerator and the dividing factor in the denominator is called the clock resolution. In one embodiment, DET is aware of the constraints on these factors which limit the clock resolution to a finite set. DET may always choose the best candidate clock resolution among equivalent ones and avoid searching redundant combinations. For example, if the base clock rate is 100 Mhz and a target rate of 133 Mhz is sought, DET will create a clock resolution of 4/3 and not 8/6 because $$\frac{4}{3} \times 100 \text{ MHz} = \frac{8}{6} \times 100 \text{ MHz}.$$

The details of timing constraints are specific to the targeted architecture.

Figure 1:
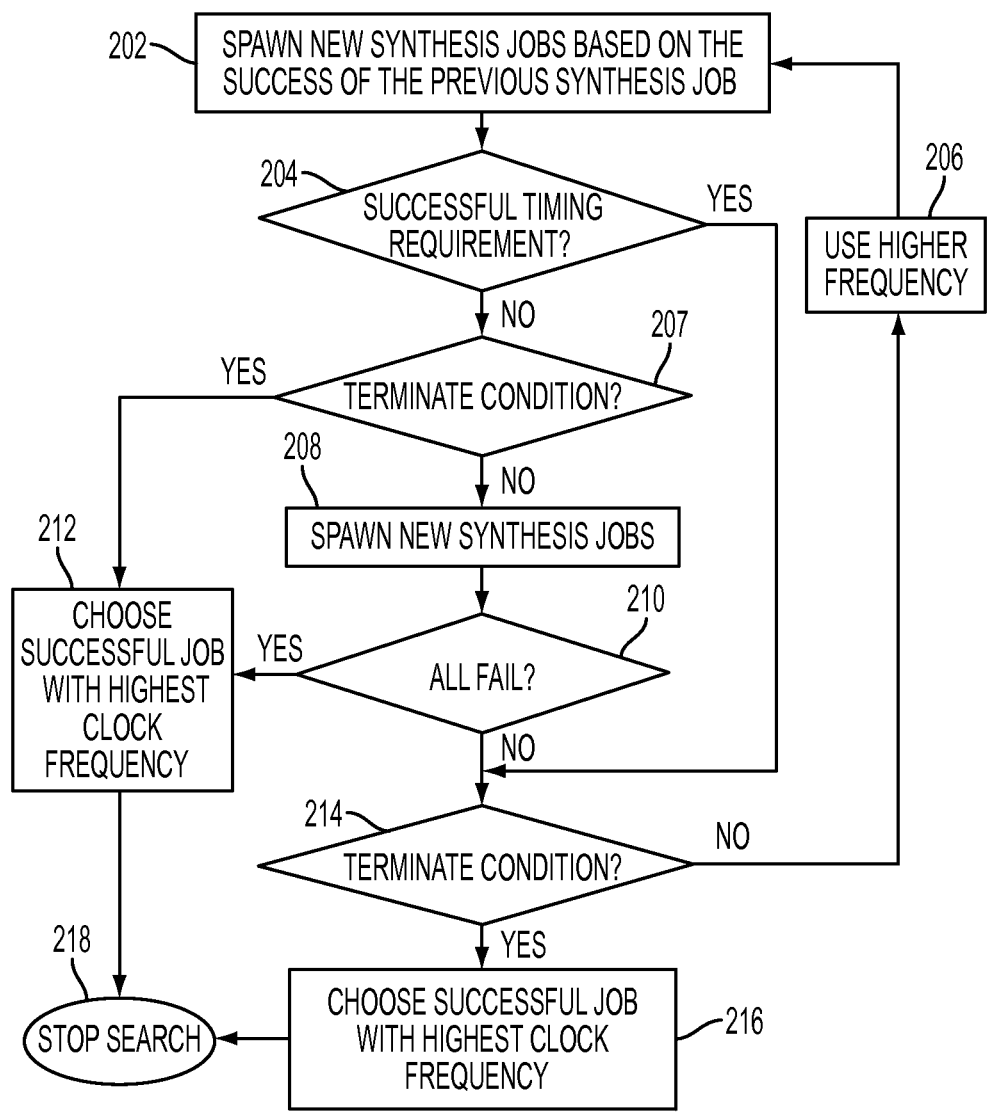
FIG. 1 is a flow diagram illustrating a method of determining best clock frequency for a hardware design in one embodiment of the present disclosure.
Figure 2:
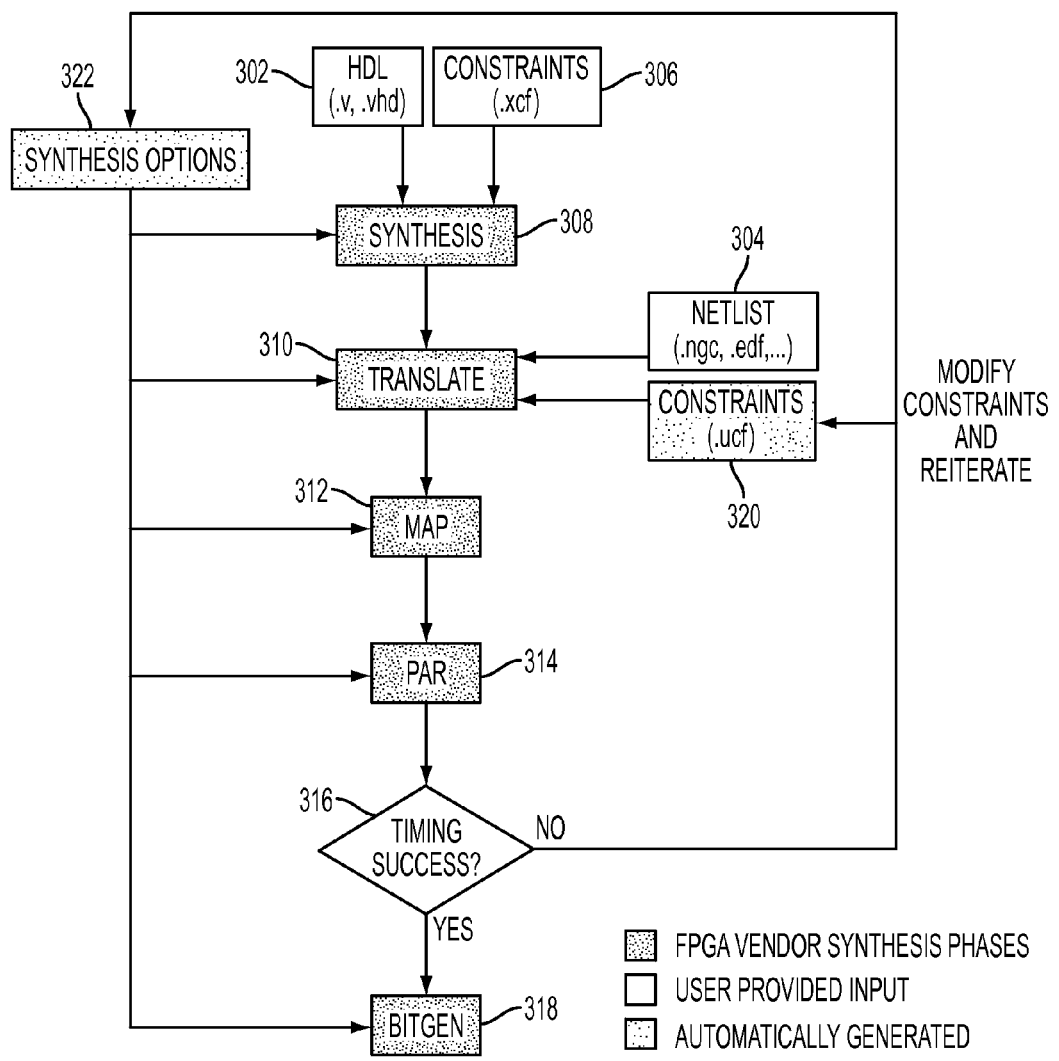
FIG. 2 illustrates a new synthesis flow according to a method in one embodiment of the present disclosure.

In one embodiment of the present disclosure, DET begins the exploration by invoking the conventional synthesis toolchain (e.g., Xilinx© synthesis tool), setting the timing constraints to specify either a given starting frequency or an automatically determined starting frequency. Each invocation of the conventional synthesis toolchain is called a synthesis job. FIG. 2 is a flow diagram illustrating a method of searching for best clock frequency for a hardware design in one embodiment of the present disclosure. At 202, DET spawns new synthesis jobs based on the success of the previous synthesis job. In this respect, multiple jobs (or instances) may be spawned to run in parallel concurrently, with each job having different timing requirement. At 204, it is determined whether a synthesized job's timing is a success. If the timing is successful, the processing continues to 214. At 214, it is determined whether a termination condition is met. If there is no termination condition at 214, higher clock frequency is specified for a new synthesis job at 206 and the logic proceeds to 202 where the new synthesis job is spawned, and the logic reiterates the process. Again, there may be more than one new synthesis job created, each testing for different timing requirement in parallel.

If a job fails timing-closure, at 207, it is determined whether the process should terminate. If so, at 212, the last successful job with the highest frequency is chosen. If there is no termination condition, at 208, two (or more) synthesis job points may be chosen: at least one with a constraint describing a clock frequency between the last successful job and the current failed job, and at least one job for a higher clock frequency constraint than the failed job. If at 210, these jobs fail, then at 212, the last successful job with the highest frequency is chosen. The highest or best clock frequency is determined to be that of the last successful job, and the search stops at 218.

If one or more jobs succeed, it is determined at 214, whether the search should be terminated. If the search is to be terminated, then at 216, the synthesis job meeting its timing requirement that has the highest clock frequency is selected out of other jobs that were synthesized and had timing success. The best clock frequency is determined to be that of the selected job, and the search stops at 210.

If the search is not to be terminated, the logic continues at 206, where different clock frequency requirement is specified for another new job, and at 202 the new job is spawned for synthesis with this different clock frequency requirement. The new job, for example, has a frequency constraint that is higher than the highest frequency job that succeeded.

In one aspect, if multiple jobs are spawned at 202, the steps following 202 may be performed for each of the jobs spawned. The number of new jobs that are spawned may depend on any third party licenses (e.g., synthesis software license requirements) and/or the load or computing capacity of the computer that is running the hardware synthesis procedures.

As shown at 210 and 212, the search may terminate if new jobs fail. The search may also terminate based on user specified thresholds or parameters, or defined default threshold or the like. Thus, for example, determination at 207 and 214, whether to stop the search may be based on one or more criteria. One example may be if the difference in the clock frequencies between two successful jobs is smaller than a defined threshold, e.g., which may be specified by a user or set as a default value. In this case, the clock frequency from the latest successful run may be selected. As another example, a target clock frequency may be specified, for instance, by a user or as a default value, and if the target is found, the search may terminate. Yet another example of a stop criterion may be the number of synthesis jobs that are run for the search. Another example may be the total amount of time spent in searching or iteration of spawning new jobs for the search. The best result out of those runs may be selected. Still yet, a user may be enabled to monitor the search processes, for example, via a user interface remotely or locally, and manually select to stop the search. Successive synthesis failures for jobs with clock frequency target differing by a small delta may be another example, in which case the clock frequency from the latest successful run is selected. Other criterion may be set or used. One or combinations of stop criterion may be used for determining whether to terminate the search.

The methodology in one embodiment of the present disclosure of searching for clock frequency for hardware design such as FPGA-based design generates constraint (e.g., timing requirement such as clock frequency) independent of user codes. So for example, the user code at 202 need not be modified while searching for the clock frequency that is considered to be the best. In one embodiment, the source code may be partitioned into sets, and DET is only applied to those sets for which altering the clock frequency of the synthesized hardware is semantically permissible.

In yet another embodiment, DET may run remotely and asynchronously in a cloud environment or on a remote machine. Remote DET runs may be monitored via a web interface. In this embodiment, the list of files described in the manifest may be transmitted to the remote machine via shared storage or via a network.

The methodologies of the present disclosure may be implemented as a hardware (e.g., FPGA) synthesis tool (e.g., DET described above), which in one embodiment when given a hardware design and an initial set of constraints, automatically explores the search space to find the best clock frequency for the design. The tool may do this without modifying the input design. Without this capability, programmers need to manually adjust their designs and repeat the synthesis until they achieve a desirable solution. Programmers who may not be familiar with hardware (e.g., FPGA) design flows or well versed in the art of hardware synthesis, may be left with suboptimal solutions which run the synthesized hardware at lower frequencies than may be possible if they explored the search space of feasible clock frequencies more thoroughly. The methodologies of the present disclosure in one embodiment may automate the search space exploration in a manner that does not affect the given hardware design, but rather by modifying the set of constraints the synthesis tool flow operates on. As a result, designs will synthesize to hardware and run with the determined highest clock frequency.

FIG. 2 illustrates a new synthesis flow utilizing a method of the present disclosure in one embodiment. The methodology in one embodiment generates both synthesis options and constraints while sequencing through a number of steps until it finds a set of constraints which synthesize the design into hardware at the highest possible clock frequency found. A synthesis tool of the present disclosure may receive from a user a design specification, for example, in a form of HDL 302 and a netlist 304, and its constraints 306. Constraints 306, for example, may include timing, synthesis and other implementation constraints. The synthesis at 308 may generate a netlist file. A user may also provide a netlist 304, for example, which may specify logical data and also more constraints.

A synthesis step 308, the code 302 may be analyzed to determine specific design building blocks or macros, e.g., adders and subtractors, multiplexers (MUXs), memory, and for example to identify finite state machines. The determined building blocks may be generated into a netlist.

A translate step 310 translates the generated netlist list into a logical description of the design, for example, in terms of logic elements such as logic gates (e.g., AND gates, OR gates), LUTs, flip-flops, and RAMs. The translation, for example, may be also performed on the netlist 304 provided by a user. The translation may merge multiple designs files into logical description.

A map step 312 groups logical symbols or description generated by the translation 310 into physical components, for example, specific resources or circuit elements such as functional units and registers, for example, of a FPGA or like.

A place and route (PAR) step 314 takes the mappings of the map step 312, for example, in a form of a file describing the native circuit description, and places and routes the design, e.g., places components onto the chip, connects the components, and extracts timing data. The output of the PAR 314, for example, in a form of a file may be used to generate bitstreams at 318.

At 316, it is determined whether the clock-frequency timing is a successful frequency. If so, bitstream, or like data that a processor (e.g., FGPA) can understand, is generated at 318. If it is determined that the clock frequency timing is not a successful frequency, further constraints are automatically generated at 320 and different synthesis options are automatically generated at 322, and the synthesis 308, translate 310, map 312, and PAR 314 functionalities are repeated using the automatically generated synthesis options and constraints. The test is again performed at 316. Those functions are iterated until a successful clock-frequency is determined. The constraints that are automatically generated at 320 may include different timing constraints such as different clock frequency.

At 316, whether the clock-frequency timing is successful or not may be determined based on whether a user specified threshold has been met, or whether the timing is the best or highest clock frequency the methodology of the present disclose can discover.

Figure 3:
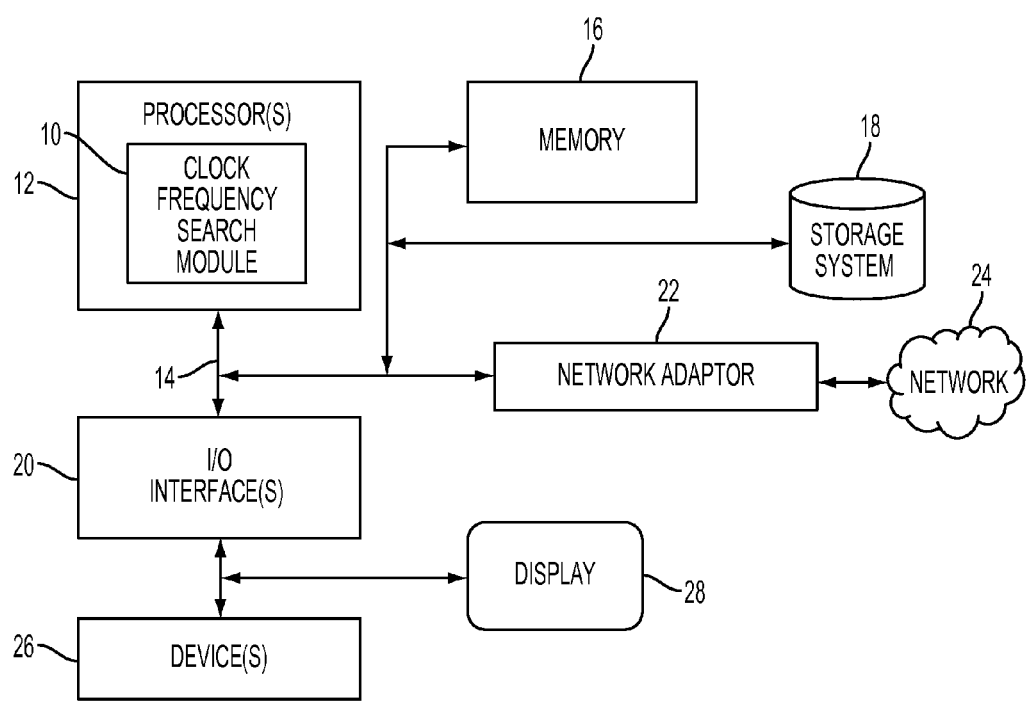
FIG. 3 illustrates a schematic of an example computer or processing system that may implement determining best clock frequency for hardware design in one embodiment of the present disclosure.

FIG. 3 illustrates a schematic of an example computer or processing system that may implement determining best clock frequency for hardware design in one embodiment of the present disclosure. The computer system is only one example of a suitable processing system and is not intended to suggest any limitation as to the scope of use or functionality of embodiments of the methodology described herein. The processing system shown may be operational with numerous other general purpose or special purpose computing system environments or configurations. Examples of well-known computing systems, environments, and/or configurations that may be suitable for use with the processing system shown in FIG. 3 may include, but are not limited to, personal computer systems, server computer systems, thin clients, thick clients, handheld or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

The computer system may be described in the general context of computer system executable instructions, such as program modules, being executed by a computer system. Generally, program modules may include routines, programs, objects, components, logic, data structures, and so on that perform particular tasks or implement particular abstract data types. The computer system may be practiced in distributed cloud computing environments where tasks are performed by remote processing devices that are linked through a communications network. In a distributed cloud computing environment, program modules may be located in both local and remote computer system storage media including memory storage devices.

The components of computer system may include, but are not limited to, one or more processors or processing units 12, a system memory 16, and a bus 14 that couples various system components including system memory 16 to processor 12. The processor 12 may include a clock frequency search module 10 that performs the methods described herein. The module 10 may be programmed into the integrated circuits of the processor 12, or loaded from memory 16, storage device 18, or network 24 or combinations thereof. The module 10 may be part of a hardware synthesis tool or cooperate with such tool to perform the functions described herein.

Bus 14 may represent one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

Computer system may include a variety of computer system readable media. Such media may be any available media that is accessible by computer system, and it may include both volatile and non-volatile media, removable and non-removable media.

System memory 16 can include computer system readable media in the form of volatile memory, such as random access memory (RAM) and/or cache memory or others. Computer system may further include other removable/non-removable, volatile/non-volatile computer system storage media. By way of example only, storage system 18 can be provided for reading from and writing to a non-removable, non-volatile magnetic media (e.g., a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 14 by one or more data media interfaces.

Computer system may also communicate with one or more external devices 26 such as a keyboard, a pointing device, a display 28, etc.; one or more devices that enable a user to interact with computer system; and/or any devices (e.g., network card, modem, etc.) that enable computer system to communicate with one or more other computing devices. Such communication can occur via Input/Output (I/O) interfaces 20.

Still yet, computer system can communicate with one or more networks 24 such as a local area network (LAN), a general wide area network (WAN), and/or a public network (e.g., the Internet) via network adapter 22. As depicted, network adapter 22 communicates with the other components of computer system via bus 14. It should be understood that although not shown, other hardware and/or software components could be used in conjunction with computer system. Examples include, but are not limited to: microcode, device drivers, redundant processing units, external disk drive arrays, RAID systems, tape drives, and data archival storage systems, etc.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages, a scripting language such as Perl, VBS or similar languages, and/or functional languages such as Lisp and ML and logic-oriented languages such as Prolog. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The computer program product may comprise all the respective features enabling the implementation of the methodology described herein, and which—when loaded in a computer system—is able to carry out the methods. Computer program, software program, program, or software, in the present context means any expression, in any language, code or notation, of a set of instructions intended to cause a system having an information processing capability to perform a particular function either directly or after either or both of the following: (a) conversion to another language, code or notation; and/or (b) reproduction in a different material form.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements, if any, in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

Various aspects of the present disclosure may be embodied as a program, software, or computer instructions embodied in a computer or machine usable or readable medium, which causes the computer or machine to perform the steps of the method when executed on the computer, processor, and/or machine. A program storage device readable by a machine, tangibly embodying a program of instructions executable by the machine to perform various functionalities and methods described in the present disclosure is also provided.

The system and method of the present disclosure may be implemented and run on a general-purpose computer or special-purpose computer system. The terms "computer system" and "computer network" as may be used in the present application may include a variety of combinations of fixed and/or portable computer hardware, software, peripherals, and storage devices. The computer system may include a plurality of individual components that are networked or otherwise linked to perform collaboratively, or may include one or more stand-alone components. The hardware and software components of the computer system of the present application may include and may be included within fixed and portable devices such as desktop, laptop, and/or server. A module may be a component of a device, software, program, or system that implements some "functionality", which can be embodied as software, hardware, firmware, electronic circuitry, or etc.

The embodiments described above are illustrative examples and it should not be construed that the present invention is limited to these particular embodiments. Thus, various changes and modifications may be effected by one skilled in the art without departing from the spirit or scope of the invention as defined in the appended claims.

We claim:

1. A method of searching for desired clock frequency for integrated circuit-based design, comprising:
    (a) receiving timing result of a hardware synthesis job executed based on a code specifying hardware design;
    (b) automatically generating without modifying the code, one or more different timing constraints specifying respectively one or more different clock frequencies than used in the hardware synthesis job;
    (c) automatically spawning, by a processor, one or more instances of the hardware synthesis job to run with the respective one or more different timing constraints;
    (d) repeating the steps of automatically generating and automatically spawning until a termination criterion is met, or a desired successful timing constraint is identified for the hardware design from the different timing constraints based on whether said one or more instances of the hardware synthesis job met their respective timing constraints, or combination of both the termination criterion is met and the desired successful timing constraint is identified, wherein if the received timing result indicates that a timing constraint is not satisfied, the generating at (b) includes generating a first new timing constraint specifying higher clock frequency than a previously specified clock frequency and a second new timing constraint specifying lower clock frequency than the previously specified clock frequency but higher than clock frequency of a last hardware synthesis job that satisfied its timing constraint, and the automatically spawning at (c) includes running a first instance of the hardware synthesis job with the first new timing constraint and a second instance of the hardware synthesis job with the second new timing constraint, without modifying the code,
    (c1) if both the first instance and the second instance do not meet the respective first new timing constraint and the second new timing constraint, selecting the clock frequency of the last hardware synthesis job that satisfied its timing constraint, and (c2) if either or both of the first instance and the second instance's timing criterion is satisfied, generating the different timing constraint specifying higher clock frequency than either or both of the first instance or the second instance that satisfied their respective timing criteria and repeating running of the hardware synthesis job with the newly specified clock frequency without modifying the code, and the repeating at (d) includes repeating (a), (b), (c), (c1) and (c2), until a termination criterion is met, wherein highest clock frequency among all hardware synthesis jobs run until the termination criterion is met is selected.

2. The method of claim 1, wherein if the received timing result indicates that a successful timing constraint is satisfied, the generating at (b) includes generating a different timing constraint specifying higher clock frequency than a previously specified clock frequency and at (d) repeating running of the hardware synthesis job with the newly specified clock frequency without modifying the code.

3. The method of claim 1, wherein multiple hardware synthesis jobs are invoked concurrently with a plurality of different timing constraints at (c) and (a), (b), (c), (d) are repeated for each of the multiple hardware synthesis jobs.

4. The method of claim 1, wherein multiple hardware synthesis jobs are invoked concurrently with a plurality of different timing constraints at (c) and the method further includes balancing license usage for running said multiple hardware synthesis jobs.

5. The method of claim 1, wherein multiple hardware synthesis jobs are invoked concurrently with a plurality of different timing constraints at (c) and the method further includes balancing resource utilization for running said multiple hardware synthesis jobs.

6. The method of claim 1, wherein the termination criterion includes one or more of:
   both the first instance and the second instance do not meet the respective first new timing constraint and the second new timing constraint at (c1);
   a default delta threshold value indicating a difference in clock frequency between two hardware synthesis jobs;
   a range of permissible clock resolutions being exhausted;
   successful timing closure based on user assigned target clock frequency;
   a defined number of synthesis runs;
   a defined amount of time spent; or
   a user manually selecting to terminate the searching.

7. The method of claim 1, wherein the steps are run locally on a local computer.

8. The method of claim 1, wherein the steps are performed remotely by accessing one or more functionalities offered over a network.

9. A non-transitory computer readable storage medium storing a program of instructions executable by a machine to perform a method of searching for desired clock frequency for integrated circuit-based design, comprising:

(a) receiving timing result of a hardware synthesis job executed based on a code specifying hardware design;
   (b) automatically generating without modifying the code, one or more different timing constraints specifying respectively one or more different clock frequencies than used in the hardware synthesis job;
   (c) automatically spawning one or more instances of the hardware synthesis job to run with the respective one or more different timing constraints;
   (d) repeating the steps of automatically generating and automatically spawning until a termination criterion is met, or a desired successful timing constraint is identified for the hardware design from the different timing constraints based on whether said one or more instances of the hardware synthesis job met their respective timing constraints, or combination of both the termination criterion is met and the desired successful timing constraint is identified,
   wherein if the received timing result indicates that a timing constraint is not satisfied, the generating at (b) includes generating a first new timing constraint specifying higher clock frequency than a previously specified clock frequency and a second new timing constraint specifying lower clock frequency than the previously specified clock frequency but higher than clock frequency of a last hardware synthesis job that satisfied its timing constraint, and the automatically spawning at (c) includes running a first instance of the hardware synthesis job with the first new timing constraint and a second instance of the hardware synthesis job with the second new timing constraint, without modifying the code,
   (c1) if both the first instance and the second instance do not meet the respective first new timing constraint and the second new timing constraint, selecting the clock frequency of the last hardware synthesis job that satisfied its timing constraint, and
   (c2) if either or both of the first instance and the second instance's timing criterion is satisfied, generating the different timing constraint specifying higher clock frequency than either or both of the first instance or the second instance that satisfied their respective timing criteria and repeating running of the hardware synthesis job with the newly specified clock frequency without modifying the code, and the repeating at (d) includes repeating (a), (b), (c), (c1) and (c2), until a termination criterion is met, wherein highest clock frequency among all hardware synthesis jobs run until the termination criterion is met is selected.

10. The computer readable storage medium of claim 9, wherein if the received timing result indicates that a successful timing constraint is satisfied, the generating at (b) includes generating a different timing constraint specifying higher clock frequency than a previously specified clock frequency and at (d) repeating running of the hardware synthesis job with the newly specified clock frequency without modifying the code.

11. The computer readable storage medium of claim 9, wherein multiple hardware synthesis jobs are invoked concurrently with a plurality of different timing constraints at (c) and (a), (b), (c), (d) are repeated for each of the multiple hardware synthesis jobs.

12. The computer readable storage medium of claim 9, wherein multiple hardware synthesis jobs are invoked concurrently with a plurality of different timing constraints at (c) and the method further includes balancing license usage for running said multiple hardware synthesis jobs.

13. The computer readable storage medium of claim 9, wherein multiple hardware synthesis jobs are invoked concurrently with a plurality of different timing constraints at (c) and the method further includes balancing resource utilization for running said multiple hardware synthesis jobs.

14. The computer readable storage medium of claim 9, wherein the termination criterion includes one or more of:
   both the first instance and the second instance do not meet the respective first new timing constraint and the second new timing constraint at (c1);

a default delta threshold value indicating a difference in clock frequency between two hardware synthesis jobs;

a range of permissible clock resolutions being exhausted;

successful timing closure based on user assigned target clock frequency;

a defined number of synthesis runs;

a defined amount of time spent; or a user manually selecting to terminate the searching.

15. The computer readable storage medium of claim 9, wherein the steps are run locally on a local computer.

16. The computer readable storage medium of claim 9, wherein the steps are performed remotely by accessing one or more functionalities offered over a network.

17. A system for searching for desired clock frequency for integrated circuit-based design, comprising:

a processor;

a hardware design synthesis module operable to execute on the processor and further operable to (a) receive timing result of a hardware synthesis job executed based on a code specifying hardware design, (b) automatically generate without modifying the code, one or more different timing constraints specifying respectively one or more different clock frequencies than used in the hardware synthesis job, (c) automatically spawn one or more instances of the hardware synthesis job to run with the respective one or more different timing constraints, and (d) repeat (a), (b) and (c) until a termination criterion is met, or a desired successful timing constraint is identified for the hardware design from the different timing constraints based on whether said one or more instances of the hardware synthesis job met their respective timing constraints, or combination of both the termination criterion is met and the desired successful timing constraint is identified, wherein if the received timing result indicates that a timing constraint is not satisfied, the hardware design synthesis module is operable to generate a first new timing constraint specifying higher clock frequency than a previously specified clock frequency and a second new timing constraint specifying lower clock frequency than the previously specified clock frequency but higher than clock frequency of a last hardware synthesis job that satisfied its timing constraint, and run a first instance of the hardware synthesis job with the first new timing constraint and a second instance of the hardware synthesis job with the second new timing constraint, without modifying the code, wherein if both the first instance and the second instance do not meet the respective first new timing constraint and the second new timing constraint, the hardware design synthesis module is operable to select the clock frequency of the last hardware synthesis job that satisfied its timing constraint, and if either or both of the first instance and the second instance's timing criterion is satisfied, the hardware design synthesis module is operable to generate the different timing constraint specifying higher clock frequency than either or both of the first instance or the second instance that satisfied their respective timing criteria and the hardware design synthesis module is operable to repeat running of the hardware synthesis job with the newly specified clock frequency without modifying the code.

18. The system of claim 17, wherein if the received timing result indicates that a successful timing constraint is satisfied, the hardware design synthesis module is operable to generate a different timing constraint specifying higher clock frequency than a previously specified clock frequency and at repeat running of the hardware synthesis job with the newly specified clock frequency without modifying the code.

19. The system of claim 17, wherein multiple hardware synthesis jobs are invoked concurrently with a plurality of different timing constraints.

20. The system of claim 17, wherein multiple hardware synthesis jobs are invoked concurrently with a plurality of different timing constraints and the hardware design synthesis module is operable to balance license usage for running said multiple hardware synthesis jobs.

21. The system of claim 17, wherein multiple hardware synthesis jobs are invoked concurrently with a plurality of different timing constraints and the hardware design synthesis module is operable to balance resource utilization for running said multiple hardware synthesis jobs.

22. The system of claim 17, wherein the termination criterion includes one or more of:

both the first instance and the second instance do not meet the respective first new timing constraint and the second new timing constraint;

a default delta threshold value indicating a difference in clock frequency between two hardware synthesis jobs;

a range of permissible clock resolutions being exhausted;

successful timing closure based on user assigned target clock frequency;

a defined number of synthesis runs;

a defined amount of time spent; or a user manually selecting to terminate the searching.

\* \* \* \* \*